(12) United States Patent
Kwon et al.

(10) Patent No.: US 6,407,459 B2
(45) Date of Patent: Jun. 18, 2002

(54) CHIP SCALE PACKAGE

(75) Inventors: Yong Hwan Kwon, Suwon; Sa Yoon Kang, Seoul, both of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/853,950

(22) Filed: May 10, 2001

Related U.S. Application Data

(62) Division of application No. 09/482,216, filed on Jan. 12, 2000, now Pat. No. 6,235,552.

(30) Foreign Application Priority Data

Jul. 9, 1999 (KR) ............................................. 99-27786

(51) Int. Cl.[7] .......................... H01L 21/44; H01L 21/48; H01L 21/50; H01L 23/48
(52) U.S. Cl. ........................ 257/780; 438/108; 438/114; 438/118; 438/123; 438/127; 438/613; 257/780; 257/638; 257/704; 257/738; 257/788
(58) Field of Search ................................ 438/106, 108, 438/613, 616, 107, 114, 118, 123, 127; 257/638, 704, 738, 778, 780, 782, 673, 777, 776, 773, 737

(56) References Cited

U.S. PATENT DOCUMENTS

| 5,895,229 A | 4/1999 | Carney et al. ............... 438/106 |
| 6,071,755 A | 6/2000 | Baba et al. .................. 439/106 |
| 6,287,893 B1 * | 9/2001 | Elenius et al. .............. 438/108 |

* cited by examiner

*Primary Examiner*—Matthew Smith
*Assistant Examiner*—Igwe W. Anya
(74) *Attorney, Agent, or Firm*—Skjerven Morrill LLP; David W. Heid

(57) ABSTRACT

A semiconductor package which includes: a semiconductor integrated circuit having chip pads formed thereon; interconnection bumps overlying on the chip pads; a patterned metal layer connecting to the interconnection bumps; a first dielectric layer under the patterned metal layer; a second dielectric layer overlying on the patterned metal layer; and terminal pads connecting to the patterned metal layer. The semiconductor package can further include external terminals connecting to the terminal pads, a third dielectric layer filling a gap between the first dielectric layer and the semiconductor integrated circuit.

5 Claims, 12 Drawing Sheets

CHIP SCALE PACKAGE

CROSS-REFERENCE TO RELATED APPLICATION

This document is related to and incorporates by reference U.S. patent application Ser. No. 09/482,216, filed Jan. 12, 2000, now U.S. Pat. No. 6,235,552, entitled "Chip Scale Package and Method for Manufacturing the Same Using Rerouting Film and Soldering".

This application is a division of and claims priority from U.S. patent application Ser. No. 09/482,160, filed Jan. 12, 2000, now U.S. Pat. No. 6,235,552 entitled "Chip Scale Package and Method for Manufacturing the Same Using Redistribution Substrate", which in turn claims priority from Korean Patent Application Number 99-27786, filed Jul. 9, 1999.

BACKGROUND OF THE INVENTION

1. Field of the Invention

The present invention generally relates to a semiconductor package and a method for manufacturing the semiconductor package, and more particularly to a chip scale package and a method for manufacturing the chip scale package at the wafer level, using a redistribution substrate.

2. Description of the Related Arts

The electronics industry has been progressing with the miniaturization of electronic devices. This trend influences semiconductor packaging technology, which enables the connection between bare IC chips and other components. Typically, a semiconductor package has a footprint much larger than that of the chip. To adapt to the miniaturization trend, the size difference between the package and the chip has been reduced, producing a new package type called a Chip Scale Package (or a Chip Size Package) (CSP). Among the manufacturing technologies for the CSPs is Wafer Level Chip Scale Packaging, which assembles CSPs at the wafer level, rather than separately processing individual chips.

FIG. 1 schematically shows a semiconductor wafer 10, which includes integrated circuit chips 20 and scribe lines 14 dividing the chips 20. As shown in FIG. 2 which is an enlarged view of part 'A' of FIG. 1, chip pads 22 are on each chip 20, and a passivation layer 24 covers the upper surface of the IC chip 20 except where openings through which the passivation layer 24 expose the chip pads 22.

Regarding to FIGS. 3 and 4, in conventional wafer level chip scale packaging, a dielectric layer 36 and solder bumps 38 are formed on the surface of the wafer 10. The solder bumps 38 electrically connect to the chip pads 22 of FIG. 2. Then, a sawing apparatus separates the wafer 10 along the scribe lines 14, producing individual CSPs 30.

FIG. 4 illustrates the cross-sectional structure of the CSP 30. The solder bump 38 connects to the chip pad 22 through a metal layer 34, and a first and a second dielectric layers 32 and 36 are respectively on and under the metal layer 34. Integrated circuits (not shown) are under the chip pad 22 and the passivation layer 24. In the fabrication of the CSPs 30 on the wafer 10, the first dielectric layer 32 is formed and patterned on the wafer 10 such that openings in the first dielectric layer 32 expose the chip pads 22. Then, the metal layer 34 is formed on the first dielectric layer by metal deposition and patterning, so that the metal layer 34 contacts the chip pads 22. The second dielectric layer 36 is formed on the metal layer 34 such that openings in the second dielectric layer 36 expose a portion of the metal layer 34. Finally, solder bumps 38 are formed on the exposed portion of the metal layer 34. As described above, sawing separates individual CSPs 30.

The CSPs manufactured by the above-described manufacturing method have several problems. First, coating and high-temperature curing of the dielectric layers may apply thermal stress to the integrated circuits below the dielectric layers, damaging the integrated circuits. The thinner the dielectric layers are, the smaller the thermal stress is. However, making the dielectric layer thin increases the capacitance of the CSP. Second, when the CSP is mounted on an external circuit board such that the solder bumps contact the circuit board, the connection integrity between the solder bumps and the circuit board is not reliable.

Third, since defective chips as well as good chips are packaged in wafer level, the manufacturing cost of individual CSPs increases.

SUMMARY OF THE INVENTION

In accordance with the present invention a semiconductor package is provided which includes a semiconductor integrated circuit having a plurality if chip pads formed thereon, a plurality of interconnection bumps overlying on the chip pads, and a patterned metal layer connecting the interconnection bumps. A first dielectric layer is provided under the patterned metal layer, with the first dielectric layer having a plurality of first holes through which the patterned metal layer connects to the interconnection bumps. A second dielectric layer is provided overlying the patterned metal layer, with the second dielectric layer having a plurality of second holes. A plurality of terminal pads is provided, the plurality of terminal pads connecting the patterned metal layer through the second holes.

BRIEF DESCRIPTION OF THE DRAWINGS

The various features and advantages of the present invention will be readily understood with reference to the following detailed description taken in conjunction with the accompanying drawings, wherein like reference numerals designate like structural elements, and, in which:

FIGS. 5 to 20 are partial cross-sectional views of a semiconductor wafer and/or a redistribution substrate, illustrating a method for manufacturing chip scale packages according to an embodiment of the present invention, wherein FIGS. 5 and 6 show the semiconductor wafer, FIGS. 7 to 14 show the a redistribution substrate, and FIGS. 15 to 20 show the semiconductor wafer and the redistribution substrate;

DETAILED DESCRIPTION OF THE PREFERRED EMBODIMENTS

The present invention is directed to chip scale packages and methods for manufacturing the chip scale packages. The methods fabricate multiple chip scale packages on a semiconductor wafer including integrated circuits, and separate the chip scale packages by sawing. The individualized chip scale packages can be directly mounted on a circuit board of an electronic device.

Figure 1:
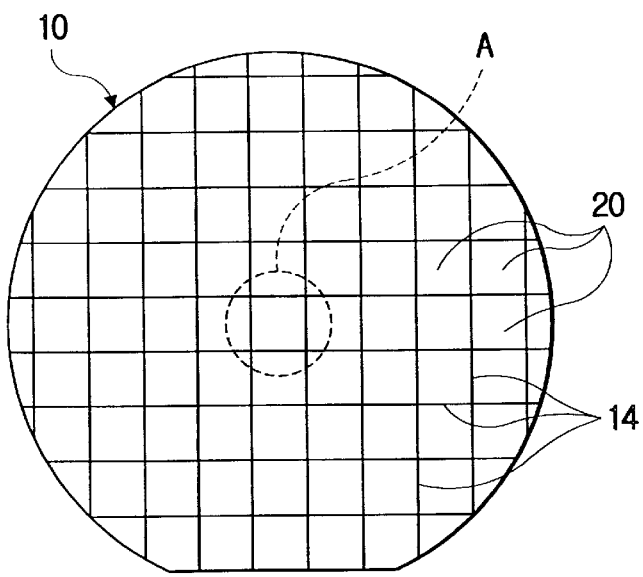
FIG. 1 is a plan view of a semiconductor wafer.
Figure 2:
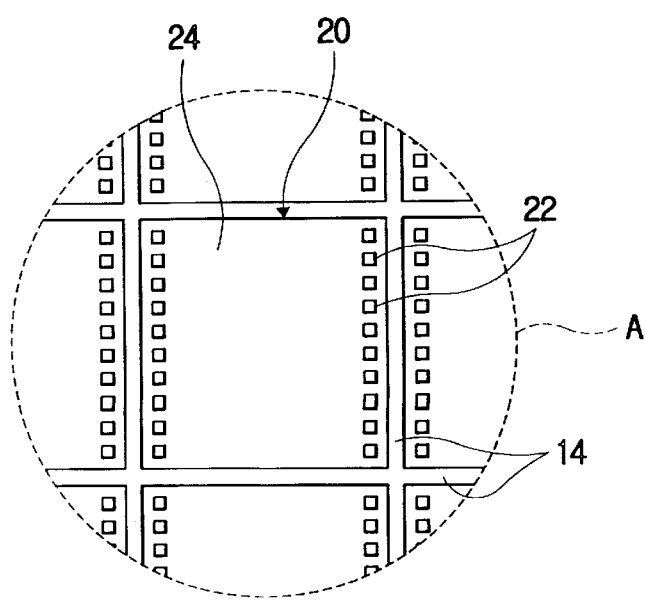
FIG. 2 is an enlarged view of a part "A" of FIG. 1.
Figure 3:
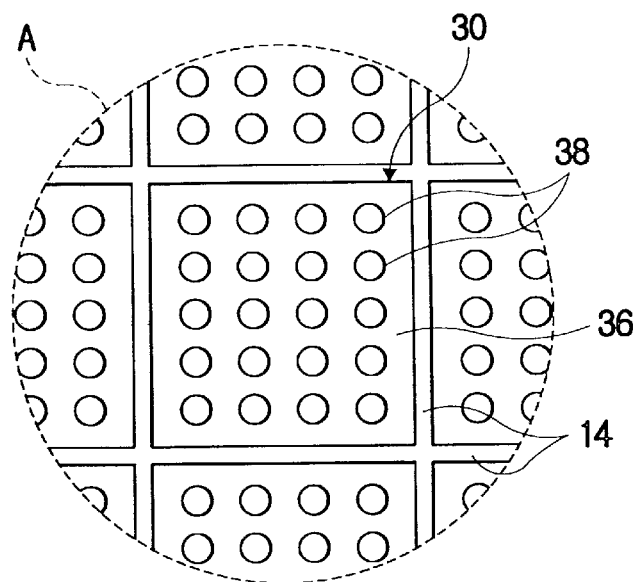
FIG. 3 is a partial plan view of a wafer conventionally processed to have multiple chip scale packages.
Figure 4:
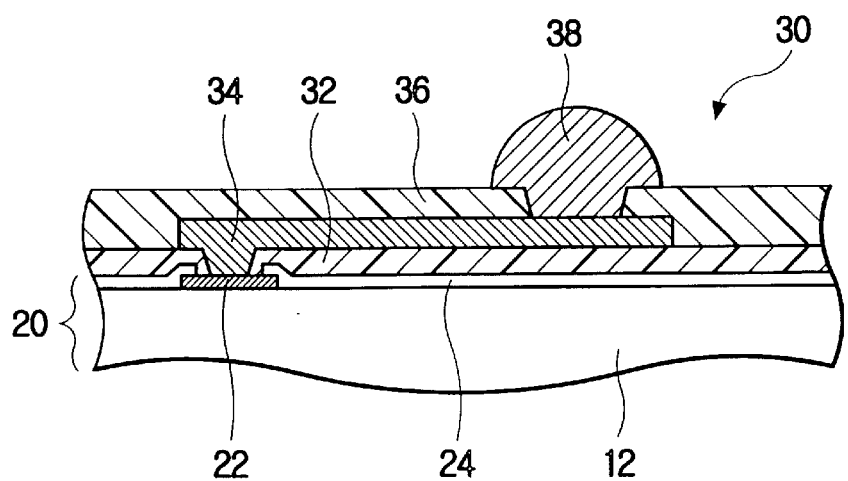
FIG. 4 is a cross-sectional view of a chip scale package of FIG. 3.
Figure 5:
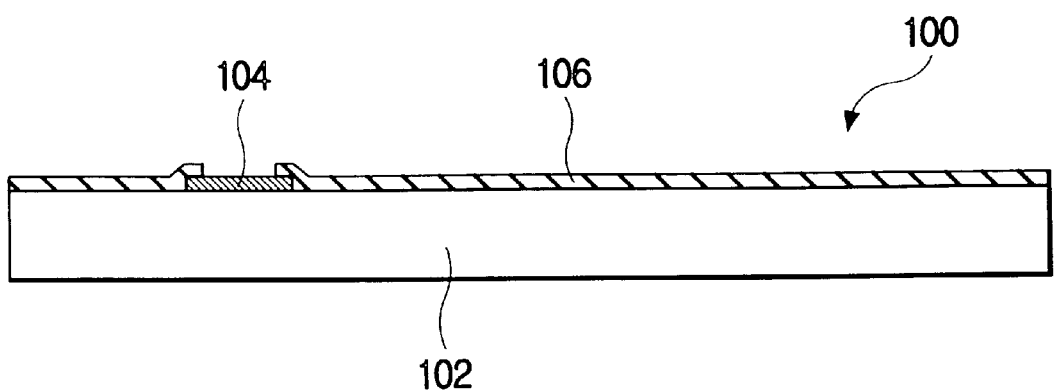

FIGS. 5 to 20 illustrate a method for manufacturing a chip scale package according to an embodiment of the present invention. Referring to FIG. 5, a known wafer fabrication method produces a wafer 100 containing integrated circuits (not shown), chip pads 104, and a passivation layer 106 on a silicon wafer substrate 102. Openings of the passivation layer 106 expose chip pads 104. The wafer 100 also includes scribe lines (not shown), which separate the integrated circuits.

Figure 6:
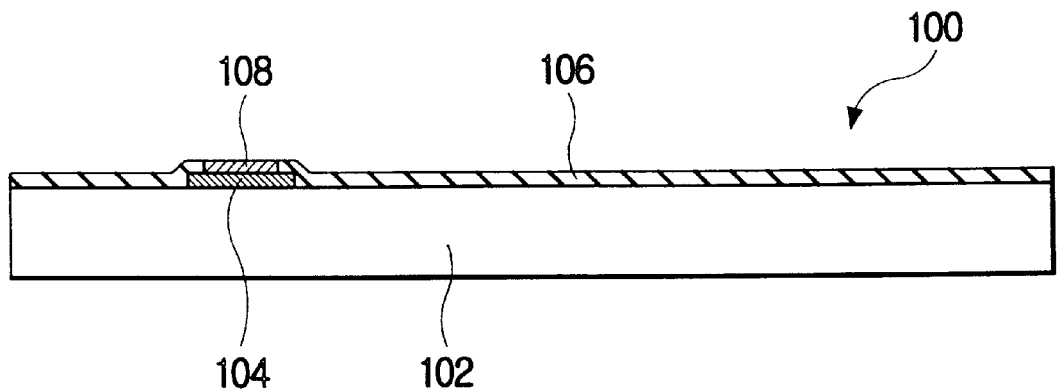

With reference to FIG. 6, an under barrier metal (UBM) 108 is formed on the chip pad 104 to increase the adhesion strength between the chip pad 104 and a solder bump to be formed on the chip pad 104. Typically, the UBM 108 is multi-layered and includes nickel (Ni), copper (Cu), gold (Au), titanium (Ti), chromium (Cr), titanium-tungsten (TiW), and/or nickel-vanadium (NiV) layers. Other metal layers also can be a part of the UBM 108. The structure of the UBM 108 and the method of fabricating the UBM 108 are well known in the art. For example, electroplating or electroless-plating can form the UBM 108. Prior to the plating but before forming the passivation, the chip pads 104 can be coated with Palladium (Pd) or Zinc (Zn) to facilitate the plating. A Pd coating can be formed by dipping the chip pads 104 in $PdCl_2$ diluted with a small quantity of HCl and $H_2O$. To form a Zn coating, the chip pads 104 are first treated with $HNO_3$, dipped in zincate solution for about 1 minute, treated with $HNO_3$ for about 15 seconds, and again dipped in zincate solution for about 1 minute.

Figure 7:
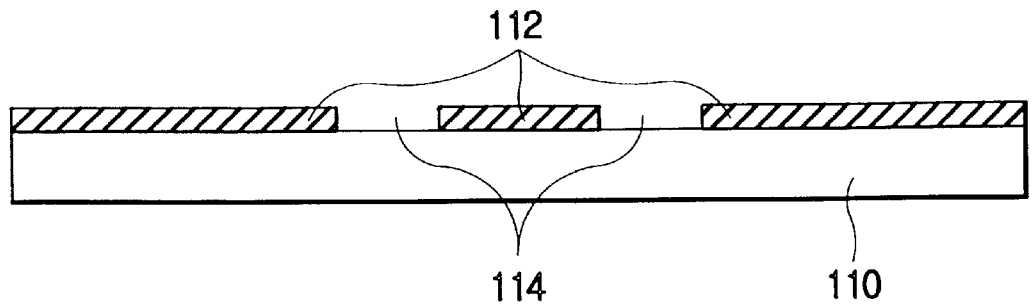

Apart from the wafer 100, a redistribution substrate is prepared. FIGS. 7 to 14 show a manufacturing process of the redistribution substrate. With reference to FIG. 7, a first dielectric layer 112 is formed on a substrate base 110, which is a metal sheet or film, preferably a copper (Cu) sheet. The first dielectric layer 112 is formed by coating a polymer such as a polyimide or a BenzoCycloButene (BCB) and patterning the coated polymer layer to form openings 114 that expose substrate base 110. A known photo-etch process can pattern the first dielectric layer 112.

Figure 8:
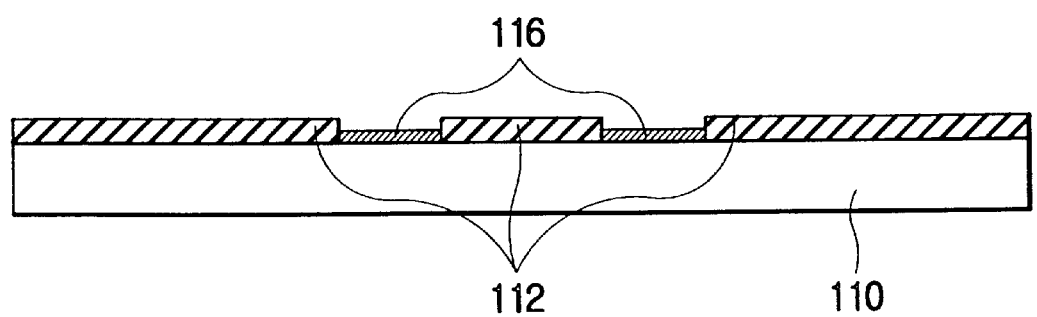

As shown in FIG. 8, after the patterning, terminal pads 116 are formed on the substrate base 110 in the openings 114 in the same way that the UBM 108 of FIG. 6 was formed. For instance, when electroplating forms the terminal pads 116, the substrate base 110 is used as a plating electrode.

Figure 9:
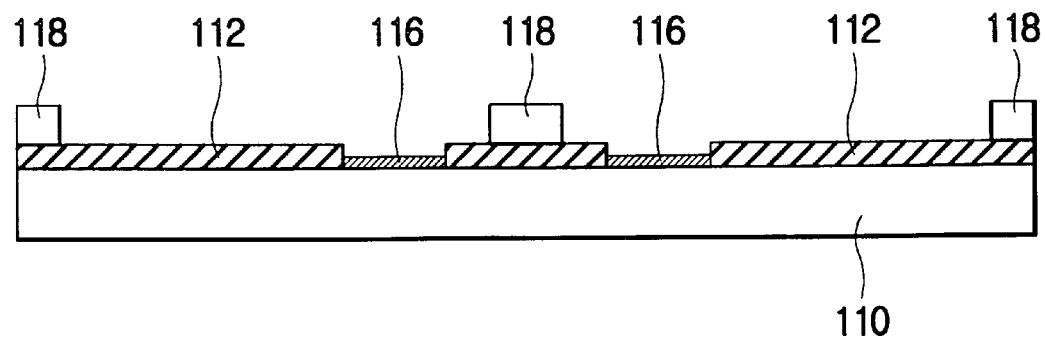
Figure 10:
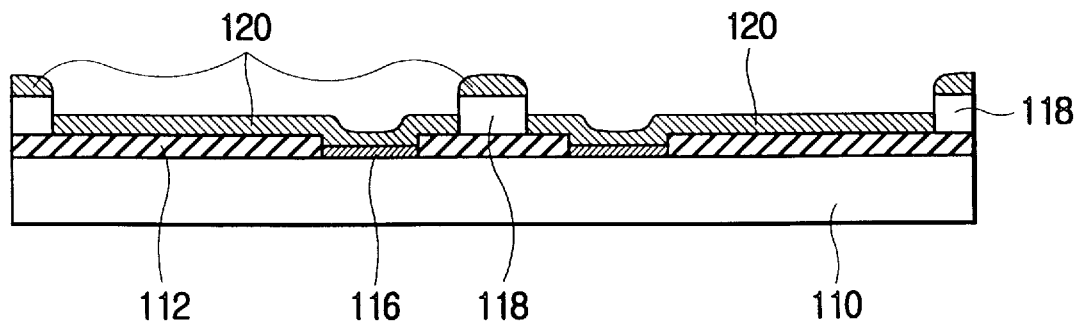
Figure 11:
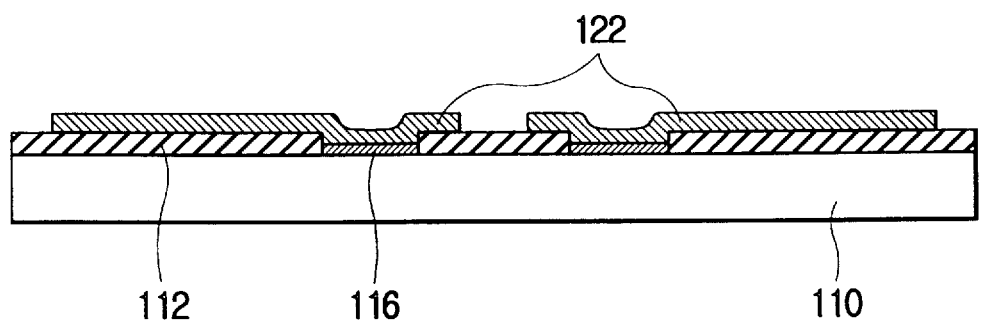

FIGS. 9 to 12 show formation of redistributed metal patterns 122. First, a photoresist layer 118 is formed by known coating and photo-etch processes on the first dielectric layer 112 as shown in FIG. 9. Then, as shown in FIG. 10, a known chemical vapor deposition forms a metal layer 120 on the first dielectric layer 112 and the photoresist layer 118. Then, by removing the photoresist layer 118 and the metal layer 120 on the photoresist layer 118, the redistributed metal patterns 122 are obtained. The redistributed metal patterns 122 can be made of Copper (Cu), Aluminum (Al), Zinc (Zn), Iron (Fe), Platinum (Pt), Cobalt (Co), Lead (Pb), Nickel (Ni), or their alloys.

Figure 12:
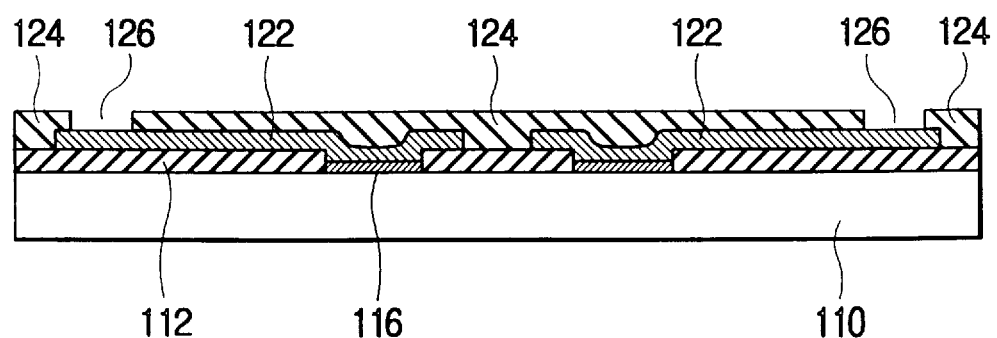

In FIG. 12, a second dielectric layer 124 is formed of a polymer, such as polyimide or BCB, on the redistributed metal patterns 122 in the same way that the first dielectric layer 112 of FIG. 7 is formed. The second dielectric layer 124 has second openings 126 through which the redistributed metal patterns 122 is exposed. Second openings 126 have positions that coincide with the chip pads 104 (FIG. 5).

Figure 13:
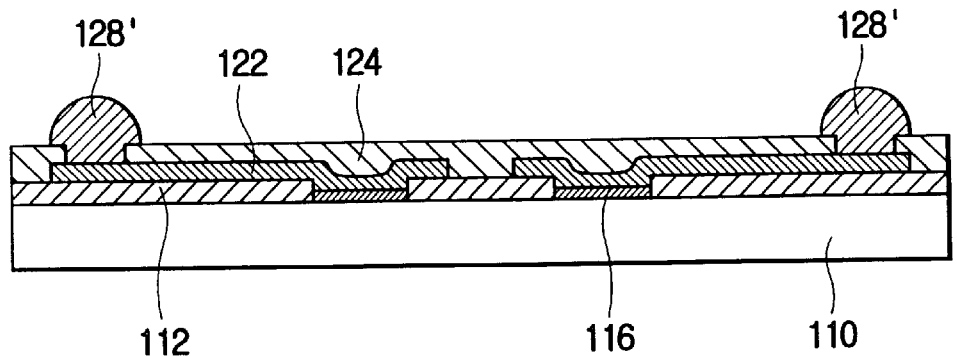
Figure 14:
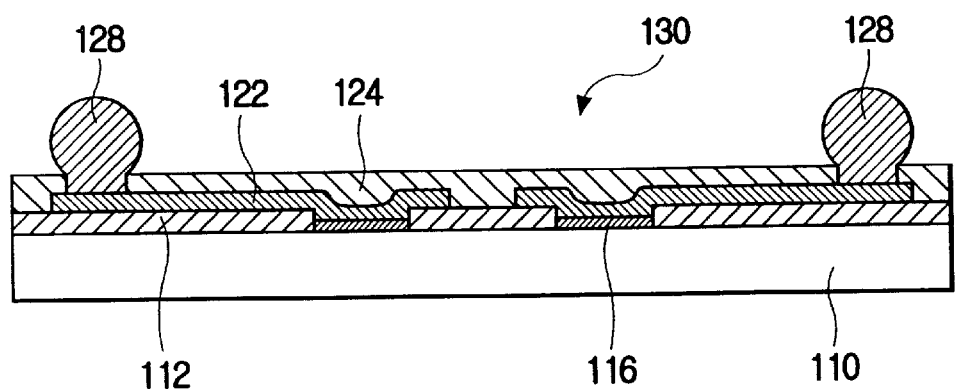

FIGS. 13 and 14 illustrate the formation of interconnection bumps 128 on the portion of the redistributed metal patterns 122 exposed through the second openings 126. Electroplating a metal such as solder can form pre-interconnection bumps 128' on the exposed redistributed metal patterns 122 using the substrate base 110 as plating electrode. Then, reflowing the pre-interconnection bumps 128' forms the interconnection bumps 128 in ball shape through melting and solidifying of the pre-interconnection bumps 128'. As a result, the processes in FIGS. 7 to 14 manufactures a redistribution substrate 130. According to the above-described method, the redistribution substrate 130 is manufactured separately from the wafer 100, and thus the integrated circuit chips of the wafer 100 are not damaged by process conditions associated with forming dielectric layers in the known wafer level chip scale packaging.

Figure 15:
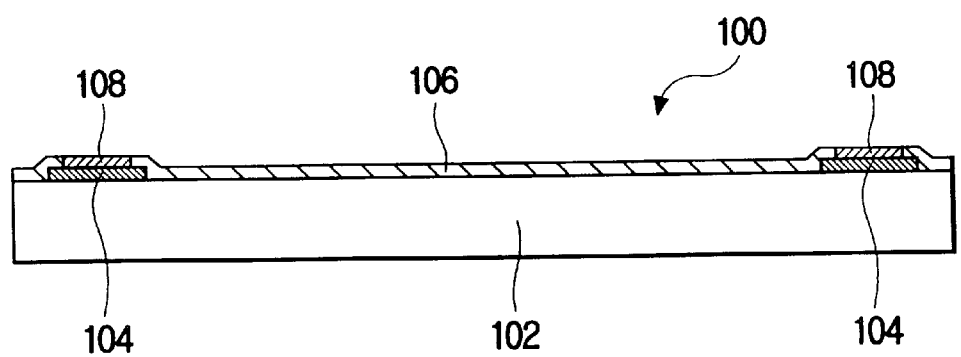
Figure 16:
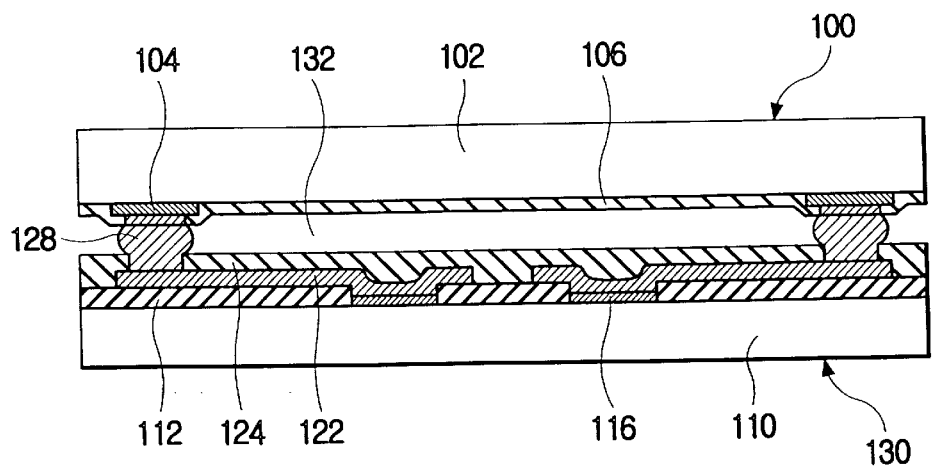

After the redistribution substrate 130 is manufactured, the wafer 100 of FIG. 15, which is identical to the wafer 100 of FIG. 6, is attached to the redistribution substrate 130 as shown in FIG. 16. As shown, the interconnection bumps 128 of the redistribution substrate 130 connect to the chip pads 104, through the UBM 108, of the wafer 100. In the attachment, the wafer 100 is placed on the redistribution substrate 130 with the interconnection bumps 128 aligned with the chip pads 104. A reflow process at 200~250° C. for about 1 to 2 minutes electrically connects the wafer 100 and the redistribution substrate 130. This reflow process is less damaging to the integrated circuits of the wafer 100 than the dielectric layer formation. For example, forming a dielectric layer typically heat the wafer to 300° C. for more than 10 minutes.

Figure 17:
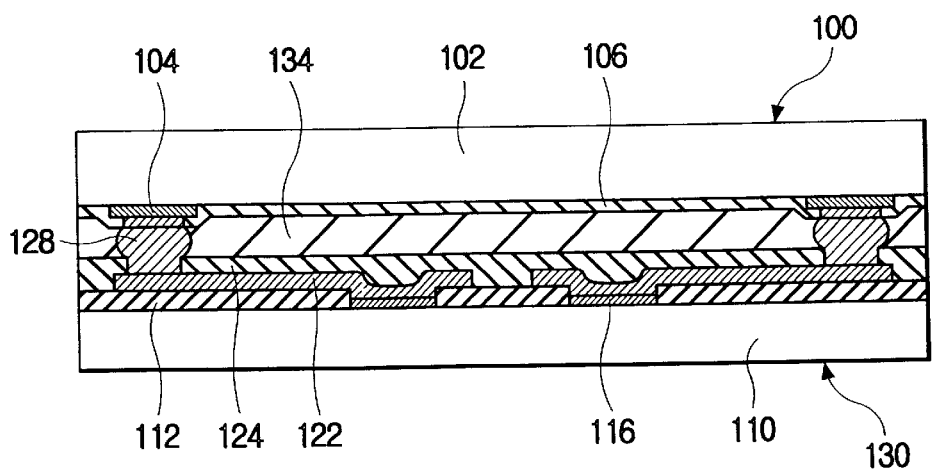

Regarding FIG. 17, after the connection of the wafer 100 to the redistribution substrate 130, an underfilling encapsulant (liquid polymer) is dispensed into a gap 132 between the redistribution substrate 130 and the wafer 100 and the filled encapsulant is cured to form a buffer layer 134. For example, an epoxy resin having viscosity of about 250 poise can fill the gap 132 and be cured at 150° C. for about 60 minutes. The buffer layer 134 absorbs the thermal stress caused by the thermal expansion coefficient mismatch between the wafer 100 and the redistribution substrate 130, preventing failure of the interconnection bumps 128. The buffer layer 134 also serves as an additional dielectric layer, decreasing the capacitance of CSPs.

Figure 18:
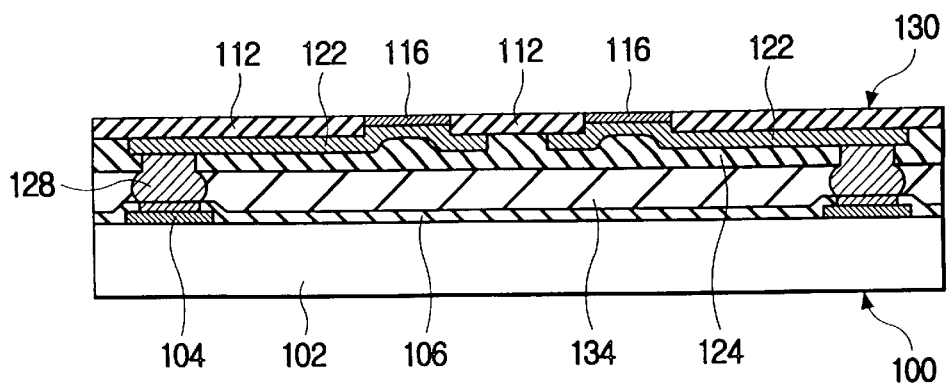
Figure 19:
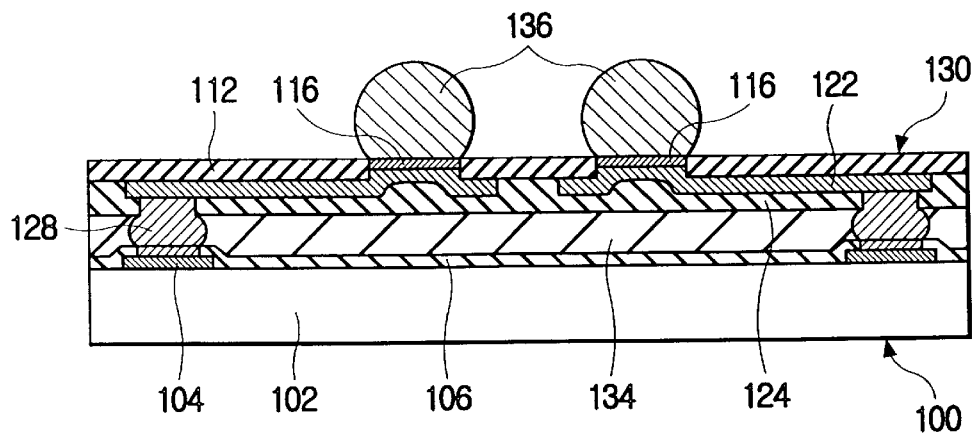
Figure 20:
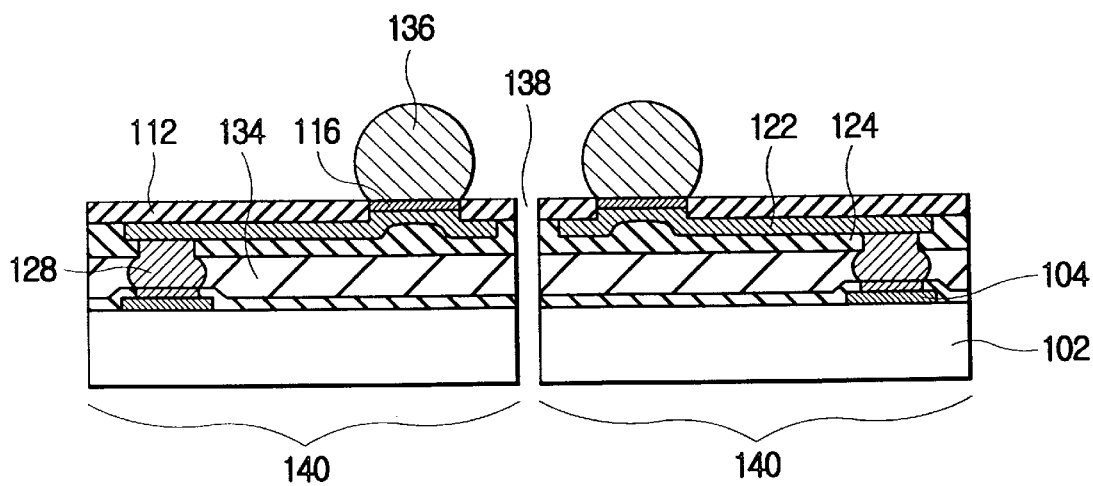

After the forming of the buffer layer 134, the substrate base 110 is removed, for example, by wet-etching, leaving the structure of FIG. 18. For a 500 μm thick copper substrate base 110, wet etching in sulfuric acid ($H_2SO_4$) and hydrogen peroxide ($H_2O_2$) for 2 hours can remove the substrate base 110, exposing the terminal pads 116. Then, as shown in FIGS. 19 and 20, a solder bump formation method well-known in the art forms external terminals 136 on the respective terminal pad 116, and a conventional sawing separates individual CSPs along scribe lines 138.

FIGS. 21 to 27 illustrate a method for manufacturing CSPs according to another embodiment of the present invention. This method is basically the same as the method described with reference to FIGS. 5 to 20. A difference is that the method of FIGS. 21 to 27 attaches individual integrated circuit chips, not the whole wafer, to the redistributed substrate. Accordingly the processes for preparing the wafer and the redistribution substrate are not explained here.

Figure 21:
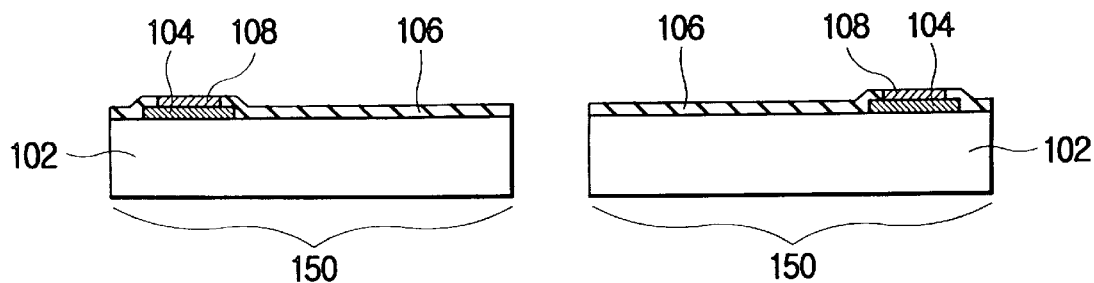
FIGS. 21 to 27 are partial cross-sectional views of a semiconductor wafer, illustrating a method for manufacturing chip scale packages according to another embodiment of the present invention.
Figure 22:
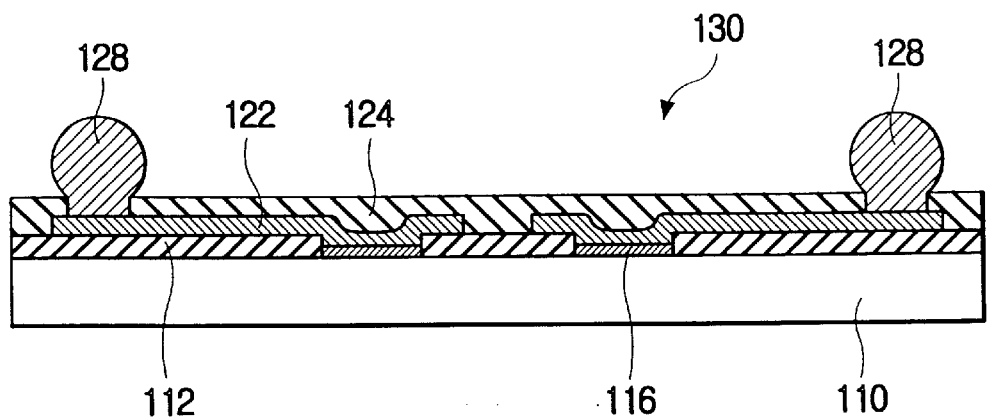
Figure 23:
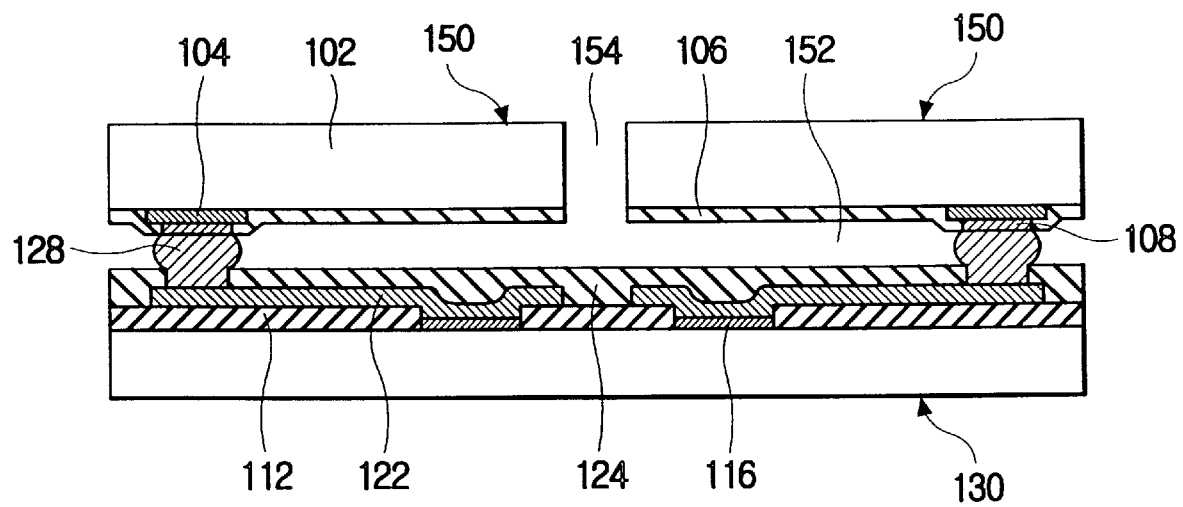

Regarding to FIG. 21, sawing separates the wafer 100 of FIG. 6 into individual integrate circuit chips 150. The redistribution substrate 130 of FIG. 22 is the same as the redistribution substrate 130 of FIG. 14. With reference to FIG. 23, the separated individual chips 150 are tested, the chips 150 that pass the test are attached to the redistribution substrate 130 in the same manner described with reference to FIG. 16. As before, the interconnection bumps 128 of the redistribution substrate 130 connect to the chip pads 104, through the UBM 108, of the wafer 100.

Figure 24:
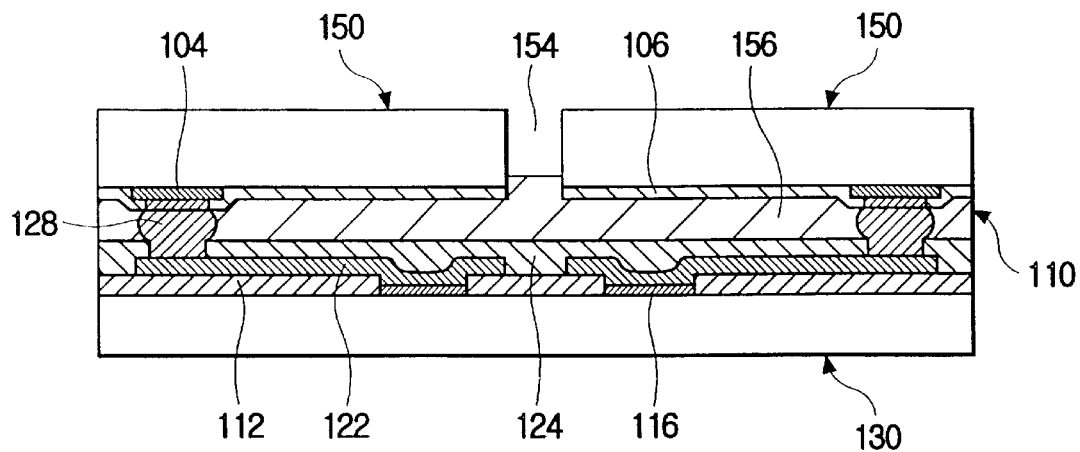
Figure 25:
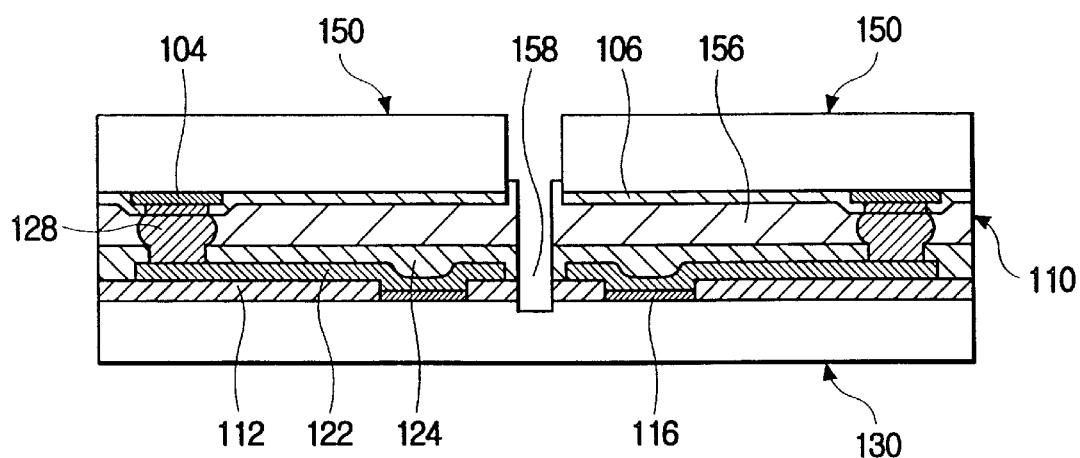
Figure 26:
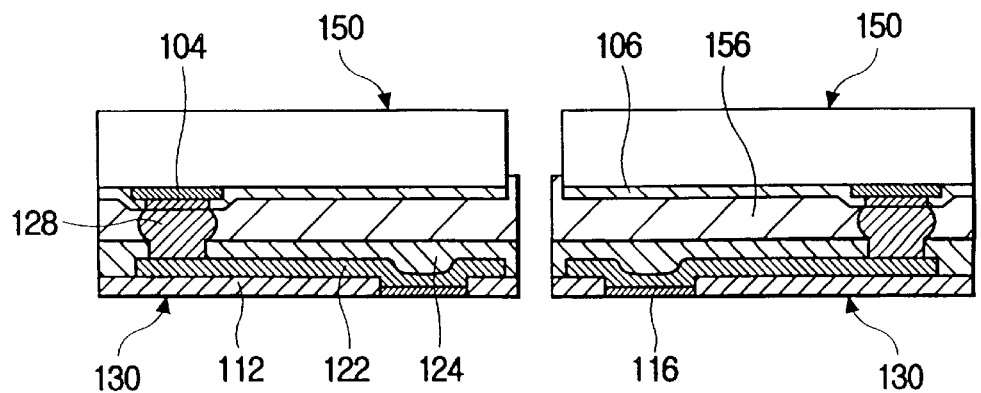
Figure 27:
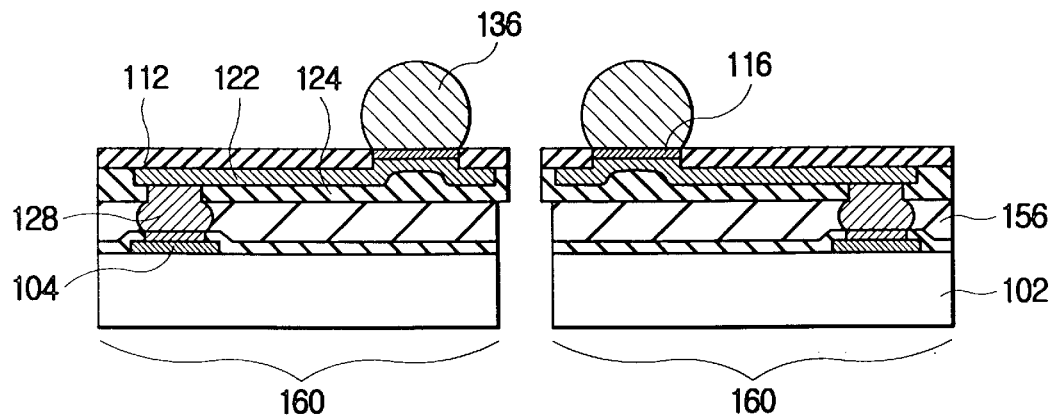
Figure 28:
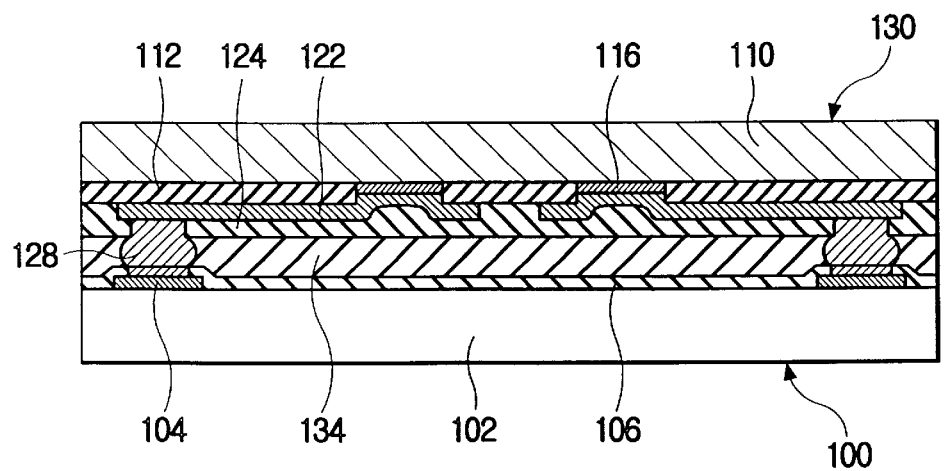
FIGS. 28 to 31 are partial cross-sectional views of a semiconductor wafer, illustrating a method for manufacturing wafer level chip scale packages according to still another embodiment of the present invention.

Regarding FIG. 24, after the connection of the chips 150 to the redistribution substrate 130, an underfilling encapsulant (liquid polymer) is dispensed into a gap 152 between the redistribution substrate 130 and the chips 150 and curing the filled encapsulant form a buffer layer 156. FIGS. 25 and 26 illustrate separation of individual chips 150 having a part of the redistribution substrate. As shown in FIG. 25, the first and the second dielectric layers 112 and 124 of the redistribution substrate 130 are partly removed by a conventional wafer sawing between the chips 150. As a result, a groove 158, which extends to the substrate base 110 of the redistribution substrate 130, is formed. Then, removing the substrate base 110 by wet-etch separates the chips 150 having parts of the redistribution substrate 130, exposing the terminal pads 116. Finally, a solder bump formation method well known in the art forms external terminals 136 on the respective terminal pads 116, and individual CSPs 160 have been manufactured. (FIG. 27).

The present invention further provides another wafer level chip scale packaging method, which is the same as the method described with reference to FIGS. 5 to 20 except for the processes associated with external terminal formation. FIGS. 28 to 31 illustrate the new external terminal formation processes. After the wafer 130 is attached to the redistribution substrate 100, while the method of FIGS. 5 to 20 removes entire substrate base 110 to expose the terminal pads 116, the method of FIGS. 28 to 31 does not expose the terminal pads 116 by partial removal of the substrate base 110. In this embodiment, the substrate base should be made of an electrically conductive metal.

Figure 29:
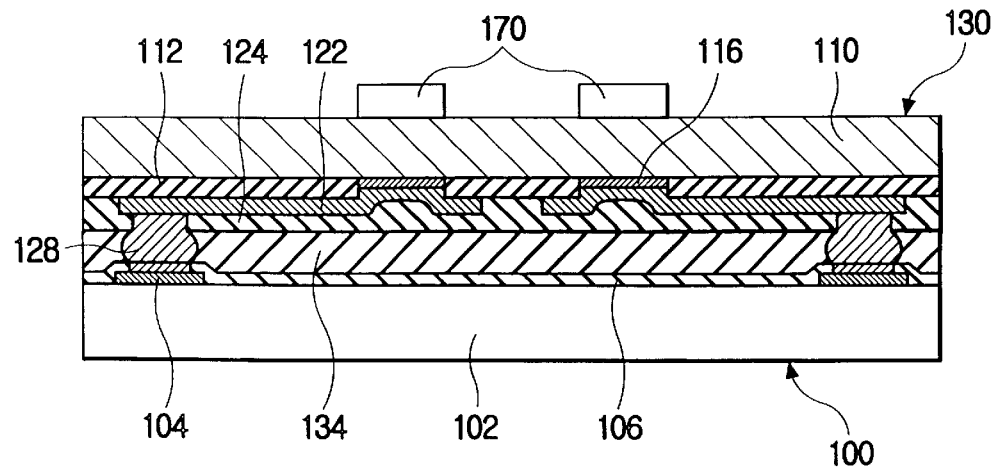
Figure 30:
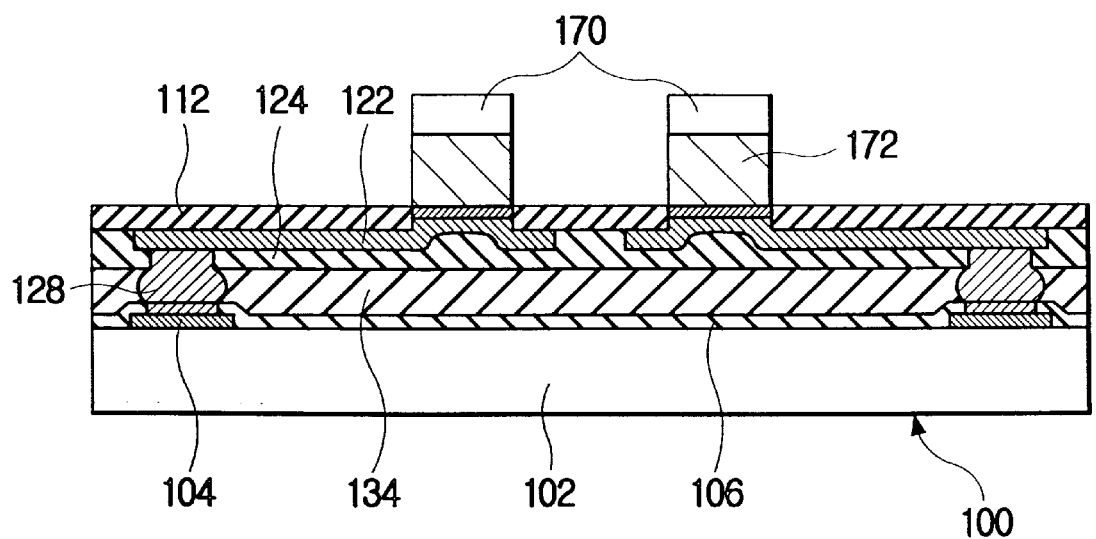
Figure 31:
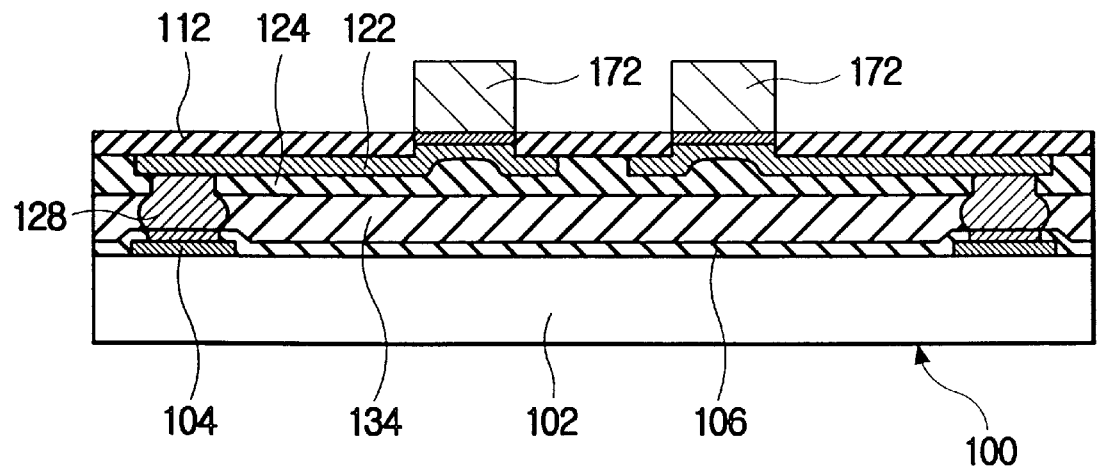

After the wafer 130 is attached to the redistribution substrate 100 (FIG. 28), as shown in FIG. 29, a photoresist pattern 170 is formed on the substrate base 110 by coating and patterning a photoresist layer, such that the photoresist pattern 170 is above the terminal pads 116. Then, etching the substrate base 110 using the photoresist pattern 170 as a mask results in a patterned substrate base 172 covered with the photoresist pattern 170 as shown in FIG. 30. Finally, as shown in FIG. 31, the photoresist pattern 170 is removed, and then patterned substrate base 172 remains to be used as external terminals 172 of individual CSPs. The individual CSPs are separated in the same way as in the method of FIG. 20.

Although specific embodiments of the present invention have been described in detail hereinabove, it should be understood that many variations and/or modifications of the basic inventive concepts herein taught still fall within the spirit and scope of the present invention as defined in the appended claims. For instance, the method of FIGS. 21 to 27 also can use the external terminal forming processes of the method of FIGS. 28 to 31.

What is claimed is:

1. A semiconductor package comprising:
   a semiconductor integrated circuit having a plurality of chip pads formed thereon;
   a plurality of interconnection bumps overlying on the chip pads;
   a patterned metal layer connecting to the interconnection bumps;
   a first dielectric layer under the patterned metal layer, the first dielectric layer having a plurality of first holes through which the patterned metal layer connects to the interconnection bumps;
   a second dielectric layer overlying on the patterned metal layer, the second dielectric layer having a plurality of second holes; and
   a plurality of terminal pads connecting to the patterned metal layer through the second holes.

2. The semiconductor package of claim 1, further comprising a plurality of external terminals connecting to the terminal pads.

3. The semiconductor package of claim 1, further comprising a third dielectric layer filling a gap between the first dielectric layer and the semiconductor integrated circuit.

4. The semiconductor package of claim 1, wherein the semiconductor integrated circuit comprises a passivation layer on a top surface of the semiconductor integrated circuit.

5. The semiconductor package of claim 1, wherein each of the chip pads comprises a metal layer thereon to improve the connection between the interconnection bumps and the chip pads.

* * * * *